United States Patent
Falco et al.

(10) Patent No.: US 10,540,050 B2
(45) Date of Patent: Jan. 21, 2020

(54) OPERATING DEVICE AND METHOD AND APPLIANCE COMPRISING SUCH A DEVICE

(71) Applicant: SEQUERIS, Paris (FR)

(72) Inventors: Jean-Louis Falco, Caissargues (FR); Sebastien Philippe, Paris (FR)

(73) Assignee: SEQUERIS, Paris (FR)

( * ) Notice: Subject to any disclaimer, the term of this patent is extended or adjusted under 35 U.S.C. 154(b) by 106 days.

(21) Appl. No.: 15/528,510

(22) PCT Filed: Nov. 26, 2015

(86) PCT No.: PCT/FR2015/053231
§ 371 (c)(1),
(2) Date: May 21, 2017

(87) PCT Pub. No.: WO2016/083750
PCT Pub. Date: Jun. 2, 2016

(65) Prior Publication Data
US 2017/0262103 A1  Sep. 14, 2017

(30) Foreign Application Priority Data
Nov. 26, 2014  (FR) ...................... 14 61530

(51) Int. Cl.
*G06F 3/046* (2006.01)
*H03K 17/96* (2006.01)
*H03K 17/94* (2006.01)
*G06F 3/044* (2006.01)

(52) U.S. Cl.
CPC .............. *G06F 3/046* (2013.01); *G06F 3/044* (2013.01); *H03K 17/941* (2013.01); *H03K 17/9622* (2013.01); *G06F 2203/04105* (2013.01); *G06F 2203/04108* (2013.01); *H03K 2217/94108* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,492,979 B1 * | 12/2002 | Kent | ...................... | G06F 3/0414 178/18.01 |
| 6,504,530 B1 * | 1/2003 | Wilson | .................. | G06F 3/0418 345/173 |
| 2008/0018604 A1 * | 1/2008 | Paun | ...................... | H03K 17/962 345/168 |
| 2009/0122007 A1 * | 5/2009 | Tsuzaki | .................. | G06F 3/0412 345/156 |
| 2011/0175832 A1 * | 7/2011 | Miyazawa | .............. | G06F 3/041 345/173 |
| 2012/0327002 A1 * | 12/2012 | Philippe | ............... | H03K 17/943 345/173 |

(Continued)

*Primary Examiner* — Priyank J Shah
(74) *Attorney, Agent, or Firm* — Patshegen IP LLC; Moshe Pinchas (57) ABSTRACT

The invention relates to an actuation device (10) comprising: detection means configured to supply a position of an object interfering with at least one electromagnetic field; a means for determining a speed of motion of the object according to the position of the object supplied by the detection means; and actuation means configured to actuate an action if: the detection means supply a position of the object, and the speed of the object is lower than a predefined speed value.

16 Claims, 6 Drawing Sheets

(56) References Cited

U.S. PATENT DOCUMENTS

| | | | | |
|---|---|---|---|---|
| 2013/0147752 A1* | 6/2013 | Simmons | ............... | G06F 3/044 345/174 |
| 2013/0201102 A1* | 8/2013 | Klinghult | ............... | G06F 3/011 345/156 |
| 2013/0314365 A1* | 11/2013 | Woolley | ................. | G06F 3/044 345/174 |
| 2014/0213323 A1* | 7/2014 | Holenarsipur | ....... | H03K 17/955 455/566 |
| 2016/0188181 A1* | 6/2016 | Smith | .................... | G06F 3/048 715/765 |

* cited by examiner

OPERATING DEVICE AND METHOD AND APPLIANCE COMPRISING SUCH A DEVICE

FIELD OF THE INVENTION

The present invention envisages an actuation device and method, and an appliance comprising such a device.

The present invention applies to the field of contact and contactless actuation devices. More specifically, the present invention applies to the field of the actuation of appliances by a user.

STATE OF THE ART

Touch-screen interfaces, in which a user touches a screen to control functions, are known. However, the sensitivity of these screens varies and the successive presses cause wear.

In addition, actuating these pieces of mechanical equipment manually or pressing a touch-screen causes unsightly marks and, over time, soiling.

Currently, the appliances comprise push buttons or switches. However, these systems have the disadvantage of operation being deteriorated if debris is introduced into the mechanism. Also, mechanical equipment and touch-screens have drawbacks in terms of hygiene and contamination risks, particularly when in collective use.

There are appliances that comprise capacitive actuation means. But these means can be triggered by objects, such as a dishtowel for example. Conversely, the capacitive buttons do not operate when the user wears a glove, are subject to variations in humidity in the air, and must be regularly re-calibrated. Therefore, the capacitive actuation means are not reliable.

SUBJECT OF THE INVENTION

The present invention aims to remedy all or part of these drawbacks.

To this end, according to a first aspect, this invention envisages an actuation device, which comprises:
  detection means configured to supply a position of an object interfering with at least one electromagnetic field;
  a means for determining a speed of motion of the object according to the position of the object supplied by the detection means; and
  actuation means configured to actuate an action if:
    the detection means supply a position of the object; and
    the speed of the object is lower than a predefined speed value.

Thanks to these provisions, when a user wants to actuate an action, he places an object (in particular a finger) opposite the detection means, in a stable manner, therefore at a speed lower than the predefined value, thereby triggering the actuation of an action. In contrast, when an object passes rapidly in front of the detection means, it triggers no action because its speed is greater than the predefined value.

In some embodiments, the detection means are configured to supply an intensity of detection of the object according to the quantity of the object's interference with each electromagnetic field.

In some embodiments, the actuation means is configured to actuate an action if:
  the detection means supply a position of the object;
  the speed of the object is lower than a predefined value; and
  the detection intensity is increasing or greater than a predefined intensity value.

In some embodiments, the predefined intensity value is a function of the maximum detection intensity reached before the decrease in the detection intensity.

Thanks to each of these provisions, false detections are more limited.

In some embodiments, the detection means is configured to supply an intensity of detection of the object according to the quantity of the object's interference with each electromagnetic field.

In some embodiments, the detection means comprise:
  first detection means:
    comprising at least one emitter of at least one wave and at least one receiver of at least one wave; and
    detecting the presence and position of an object as a function of the at least one wave received; and
  second detection means:
    detecting the presence and position of an object as a function of a physical quantity;
    the physical quantity detected by the second detection means differing by at least one characteristic from the wave received by the first detection means.

Thanks to these provisions, the determination of the position of the object is more reliable.

In some embodiments, the second detection means are only activated if the first detection means detect the presence of the object.

In some embodiments, if the first detection means detect several object positions, the actuation means actuate an action only if the second detection means supply a position of an object and only as a function of the position of the object supplied by the second detection means.

In some embodiments, the detection means supply a position equal to a weighted average of the positions supplied by the first detection means and by the second detection means.

Thanks to these provisions, the position supplied by the detection means is averaged, therefore more stable.

In some embodiments, the weight assigned to the position supplied by the first detection means is a function of an intensity of the object's interference with the electromagnetic field detected by the first detection means, and the weight assigned to the position supplied by the second detection means is a function of an intensity of the object's interference with the electromagnetic field detected by the second detection means.

Thanks to these provisions, a low-intensity parasitic detection by one of the detection means has little influence on the position taken into account.

In some embodiments, the actuation means are configured to actuate an action if:
  the first detection means detect the presence of the object;
  the second detection means detect the presence of the object; and
  the position detected by the first detection means matches the position detected by the second detection means.

In this way, contact or contactless actuation of an appliance is made possible. In addition, as two different waves are used to detect the presence and position of the object, actuation triggering errors are avoided and the device has greater reliability. Also, as the second detection means are only activated if the first detection means detect the presence of the object, energy savings are realized.

In addition, utilization of the present invention provides an actuation device having the combined advantages of two detection means while eliminating, or at least reducing, their disadvantages.

In some embodiments, the second detection means detect the presence and position of the object without a user's contact with the device.

The contactless actuation has the advantage of reducing soiling and avoiding a risk of contamination, for example.

In some embodiments, the second detection means detect the presence and position of the object by a user's contact with the device.

The advantage of these embodiments is that the position of the detected object is more precise.

In some embodiments, the second detection means detect the presence and position of the object by a user pressing on the device.

The advantage of these embodiments is to have a predefined position of the detected object at the pressing point.

In some embodiments, the actuation means are configured to actuate an action if the speed determination means determines that the first detection means detect a speed greater than a predefined speed value, and the second detection means detect the user pressing on the device.

Thanks to these provisions, an action is actuated although the initial speed of the object, determined with the first detection means, is greater than the predefined speed value, the press being considered determination of a speed becoming lower than the predefined speed limit value.

In some embodiments, the wave emitted by the detection means is an infrared wave.

These embodiments have the advantage of allowing a finger of a user to be detected, without the risk of fabric being detected, for example.

In some embodiments, at least one emitter or receiver of the detection means is associated with at least one mask, whose transparent portion, for at least one wavelength used by the emitter, is elongated in the direction of a receiver able to detect the wave of said wavelength.

Such a mask has the advantage of reducing the reception of parasitic waves.

In some embodiments, the presence of the object is detected for a power of the wave received, by a receiver of the presence detection means, inferior to a predefined limit value.

The advantage of these embodiments is to avoid taking into consideration the presence of an object, for example highly reflective, that interacts strongly with the reception means, while making it possible to take into account the presence of a finger of a user in a position to perform an actuation.

In some embodiments, the physical quantity detected by detection means is a physical quantity of an electromagnetic wave. These embodiments have the advantage of being able to accurately detect the presence and position of an object, in particular by using a capacitive emitter and receiver.

In some embodiments, the electromagnetic wave is a radio wave.

The advantage of these embodiments is to use the radio waves to detect the presence of an object, waves which can be modulated in intensity, frequency or phase, to better withstand parasitic waves and the ambient noise.

In some embodiments, the presence of the object is detected for a power of the electromagnetic wave received, by a receiver of the presence detection means, inferior to a predefined limit value.

The advantage of these embodiments is to avoid detecting the presence of an object, capacitive or made of metal for example, while making it possible to take into account the presence of a finger of a user for performing an actuation. In this way, a metal saucepan or frying pan, for example, which, because of their metallic mass, saturates the receivers, is not taken into consideration.

According to a second configuration, the present invention envisages an actuation method which comprises the following steps:
 detection supplying a position of an object interfering with an electromagnetic field;
 determination of a speed of motion of the object according to the position of the object supplied by the detection means; and
 actuation of an action if:
  the detection supplies a position of the object, and
  the speed of the object is lower than a predefined speed value.

As the particular features, advantages and aims of the method that is the subject of the present invention are similar to those of the device that is the subject of the present invention, they are not repeated here.

According to a third aspect, the present invention envisages an appliance performing a function, which comprises at least one actuation device that is the subject of the present invention, actuating said function of the appliance.

As the particular features, advantages and aims of the appliance that is the subject of the present invention are similar to those of the device that is the subject of the present invention, they are not repeated here.

BRIEF DESCRIPTION OF THE FIGURES

Other particular advantages, aims and features of the invention will become apparent from the non-limiting description that follows of at least one particular embodiment of an actuation device, an actuation method and an appliance comprising such a device, with reference to drawings included in an appendix, wherein.

DESCRIPTION OF EXAMPLES OF REALIZATION OF THE INVENTION

It is now noted that the figures are not to scale.

The present description is given as a non-limiting example, each characteristic of an embodiment being able to be combined with any other characteristic of any other embodiment in an advantageous way.

It is noted that the terms "one", "a", "an" are used in the sense of "at least one".

In general, the present invention utilizes at least one means for detecting an object interfering with at least one electromagnetic field. The object in question is, preferably, a finger. This electromagnetic field can be an optical wave, eg infrared, an electrical field, or a magnetic field. The interference can consist, for the object, of reflecting or masking the electromagnetic field, or of influencing its value measured by a detector. Each detection means is configured to estimate a relative position of the object with regard to a surface. FIGS. 1 to 5 show embodiments of the invention utilizing two sets of detection means. However, the present invention is not restricted to this number, and can comprise only one set of detection means or more than two sets of detection means.

Figure 1:
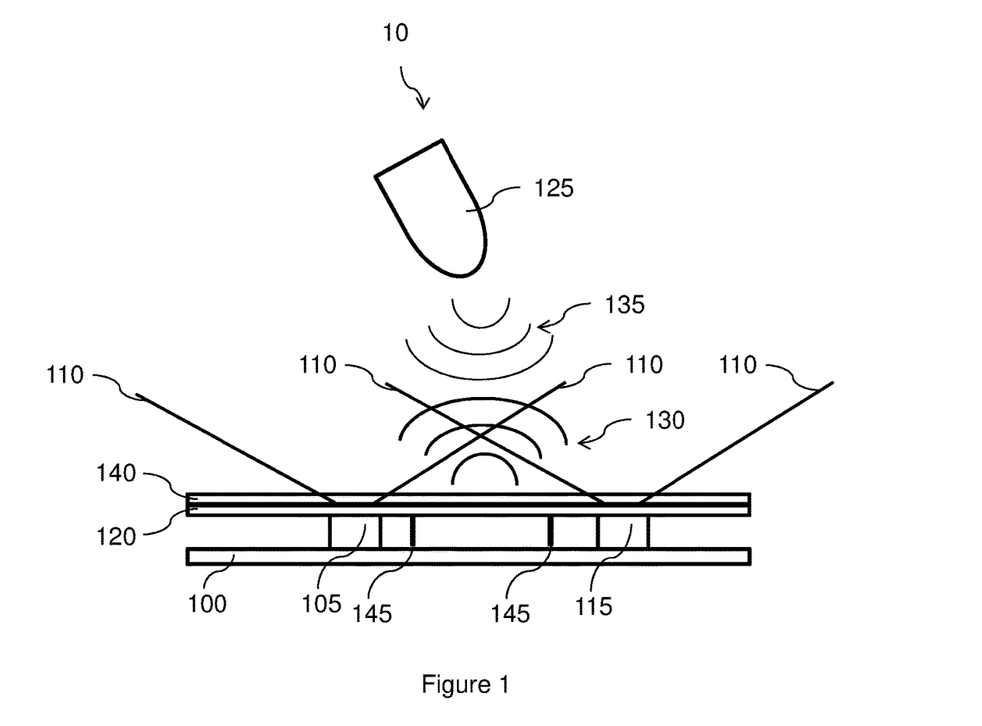
FIG. 1 represents, schematically, a particular embodiment of an actuation device that is the subject of the present invention.

FIG. 1 shows a particular embodiment 10 of a device that is the subject of the present invention.

The actuation device 10 comprises first detection means, 105, 115 and 120, comprising at least one emitter 105 of at least one wave 110 and at least one receiver 115 of at least one wave 110, and detecting the presence and position of an object 125 as a function of the at least one wave 110 received.

The device 10 also comprises second detection means, 140 and 145, which detect the presence and position of the object 125 as a function of a physical quantity 135.

The second detection means, 140 and 145, are only activated if the first detection means, 105, 115 and 120, detect the presence of the object 125.

The physical quantity detected by the second detection means, 140 and 145, differs in at least one characteristic from the wave 110 received by the receiver 115.

The device 10 also comprises actuation means 100 configured to actuate an action if:
  the first detection means, 105, 115 and 120, detect the presence of the object 125;
  the second detection means, 125, 140 and 145, detect the presence of the object 125; and
  the position detected by the first detection means, 105, 115 and 120, matches the position detected by the second detection means, 140 and 145.

Preferably, the first detection means, 105, 115 and 120, are detection means wherein each emitter emits an infrared wave 110, and each receiver captures an infrared wave. Preferably, the first detection means, 105, 115 and 120, comprise a panel 120, for spreading infrared waves 110.

The wave 110 emitted by the emitter 105 is spread by the panel 120. The wave 110 is reflected onto an object 125 that reflects infrared waves, and is captured by a receiver 115. The presence of the object 125 is therefore detected by the first detection means, 105, 115 and 120. If the object 125 absorbs the infrared waves, the presence of the object 125 is not detected by the first detection means, 105, 115 and 120.

The position of the object 125 is detected according to the place on the infrared panel 120 where the wave 110 is reflected, for example.

The use of infrared waves has the advantage of allowing a finger of a user to be detected, without the risk of fabric being detected, for example.

In some embodiments, the emitter 105 is surrounded by symbols located between said emitter and at least one receiver 115. The surface of the device 10 is opaque to the wavelengths used, except in front of the receiver 115. In front of the emitter 105, the surface of the device 10 is at least partially transparent to these wavelengths, on areas elongated in the direction of the receiver. Therefore, the power of the waves emitted by the emitter 105 is greater in the direction of the receiver 110 than in the other directions. In this way, the elongated area defines a mask, whose transparent portion, for at least one wavelength used by the emitter 105, is elongated in the direction of a receiver 115 able to detect the wave having said wavelength. This mask, whose transparent portion, for at least one wavelength used by the emitter 105, is elongated in the direction of a receiver 115 able to detect the wave 110 having said wavelength. This mask may be rectangular or elliptical, for example, the longest dimension of the mask being substantially parallel to the line connecting the emitter 105 and receiver 110. In some embodiments, such a mask is placed in front of a receiver 115, possibly combined with such a mask placed in front of an emitter 105.

Preferably, the physical quantity 135 detected by the second detection means, 140 and 145, is a physical quantity of an electromagnetic wave. Preferably, the second detection means, 140 and 145, comprise an emitter 140 of an electromagnetic wave 130 and a receiver 145 of an electromagnetic wave 135.

Preferably, the second detection means, 140 and 145, are detection means wherein an emitter is a capacitive panel 140. The capacitive panel is a surface covered by a grid accumulating a charge over the entire surface of the panel. The wave 130 emitted by the panel 140 is phase-shifted by a conductive object 125, with the conductive object 125 not in contact with the capacitive panel 140. The phase-shifted wave 135 is captured by a capacitive receiver 145. The presence of an object 125 is therefore detected. If the object 125 is not conductive, the presence of the object 125 is not detected by the second detection means, 140 and 145. Preferably, the wave 135 is an electromagnetic wave.

In some embodiments, the second detection means, 140 and 145, are detection means wherein an emitter is a capacitive panel 140. The wave 130 emitted by the panel 140 is phase-shifted by a conductive object 125 in contact with the capacitive panel 140. The phase-shifted wave 135 is captured by a capacitive receiver 145. The presence of an object 125 is therefore detected. If the object 125 is not conductive, the presence of the object 125 is not detected by the second detection means, 140 and 145.

The contactless actuation has the advantage of reducing soiling and avoiding a risk of contamination, for example.

In some embodiments, the second detection means, 140 and 145, are detection means comprising a resistive panel 140. The resistive panel 140 is a surface covered by a grid accumulating an electrical charge over the entire surface of the panel. When a user presses on the resistive panel 140, a contact point is created and the presence of an object 125 is detected.

The advantage of detecting the presence and position of the object by a user's contact is that the position of the detected object is more precise.

In some embodiments, the first detection means, 105, 115 and 120, and the second detection means, 140 and 145, are:
- infrared detection means;
- capacitive detection means;
- radio-frequency detection means;
- radio-wave detection means;
- resistive detection means;
- thermal detection means;
- mechanical detection means; or
- any other detection means.

Even though the embodiment 10 of the invention shown in FIGS. 1 to 5 is an embodiment in which the first detection means, 105, 115 and 120, are infrared detection means, and the second detection means, 140 and 145, are capacitive detection means, other embodiments, in which the detection means mentioned above are utilized, are part of the subject of the present invention.

The position of the object 125 detected by the second detection means, 140 and 145, is determined according to the location in the capacitive panel where the emitted signal 130 is deformed.

In some embodiments, the second detection means, 140 and 145, are only activated if the first detection means, 105, 115 and 120, detect the presence of the object 125.

In some embodiments, the first detection means, 105, 115 and 120, are only activated if the second detection means, 140 and 145, detect the presence of the object 125.

In some embodiments, the detection means, 105, 115 and 120, are the second detection means, and the detection means, 140 and 145, are the first detection means.

The actuation means 100 are configured to actuate an action if:
- the first detection means, 105, 115 and 120, detect the presence of the object 125;
- the second detection means, 125, 140 and 145, detect the presence of the object 125; and
- the position detected by the first detection means, 105, 115 and 120, matches the position detected by the second detection means, 140 and 145.

The action actuated is an action for raising the temperature, reducing the temperature or switching on a timer, for example. The action actuated is a function of the detected position.

Figure 2:
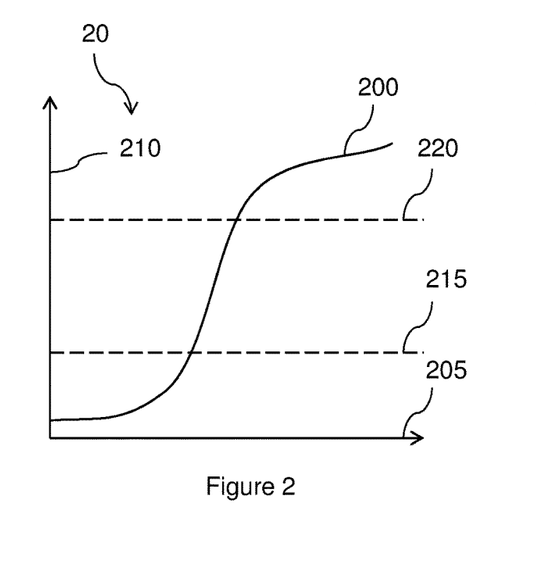
FIG. 2 represents, schematically, a particular embodiment of first detection means of a device that is the subject of the present invention.

FIG. 2 shows a first particular embodiment 20 of first detection means, 105, 115 and 120, of a device 10 that is the subject of the present invention.

The embodiment 20 is illustrated by a graph showing a signal 200 representative of a wave 110 received by the first detection means, 105, 115 and 120. The signal 200 is represented in the graph 20 comprising the time on the x-axis 205, and a received power on the y-axis 210.

The embodiment 20 comprises:
- a predefined power limit value 215, called the "lower bound"; and
- a predefined power limit value 220, called the "upper bound".

If the power of the signal 200 is less than the lower bound 215, the first detection means, 105, 115 and 120, do not detect the object 125. If the power of the signal 200 is greater than the upper bound 220, the first detection means, 105, 115 and 120, do not detect the object 125. If the power of the signal 200 is less than the upper bound 220 and greater than the lower bound 215, the first detection means, 105, 115 and 120, detect the presence of an object 125.

Thanks to the utilization of the upper limit value 220, one avoids detecting objects, for example metallic, that might have a much greater interaction with the first detection means, 105, 115 and 120, than the interaction caused by the finger of a user.

Figure 3:
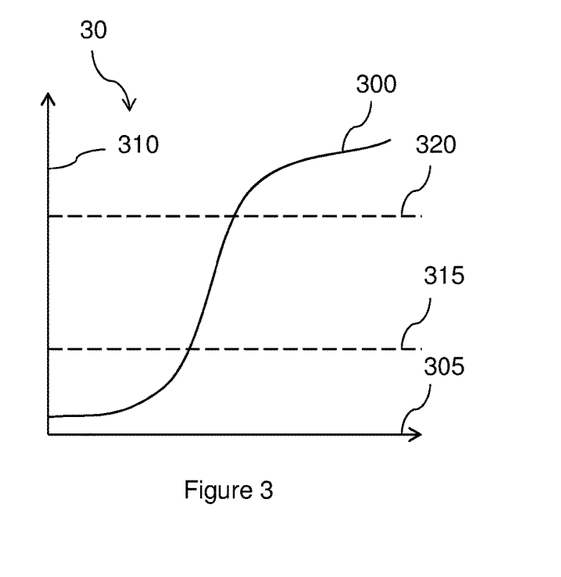
FIG. 3 represents, schematically, a particular embodiment of second detection means of a device that is the subject of the present invention.

FIG. 3 shows a first particular embodiment 30 of second detection means, 140 and 145, of a device 10 that is the subject of the present invention.

The embodiment 30 is illustrated by a graph showing a signal 300 representative of a wave 135 received by the second detection means, 140 and 145. The signal 300 is represented in the graph 30 comprising the time on the x-axis 305, and a power of a physical quantity on the y-axis 310.

The embodiment 30 comprises:
- a predefined power limit value 315, called the "lower bound"; and
- a predefined power limit value 320, called the "upper bound".

If the power of the signal 300 is less than the lower bound 315, the second detection means, 140 and 145, do not detect the object 125. If the power of the signal 300 is greater than the upper bound 320, the second detection means, 140 and 145, do not detect the object 125. If the power of the signal 300 is less than the upper bound 320 and greater than the lower bound 315, the second detection means, 140 and 145, detect the presence of an object 125.

Thanks to the utilization of the upper limit value 320, one avoids detecting objects, for example metallic, that might have a much greater interaction with the second detection means, 140 and 145, than the interaction caused by the finger of a user.

Figure 4:
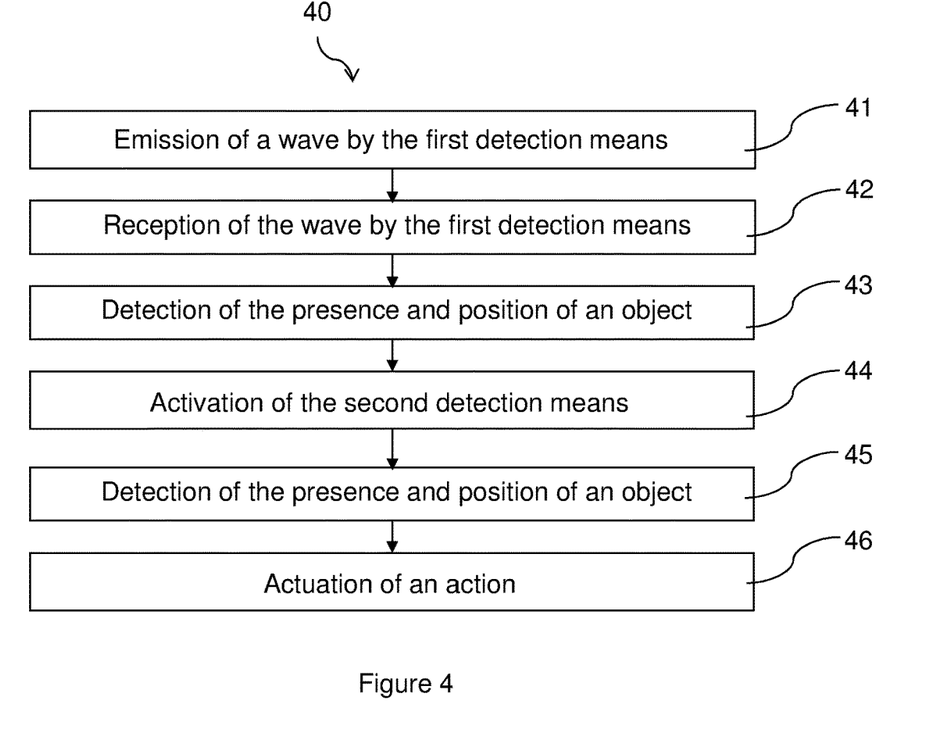
FIG. 4 represents, schematically, a particular embodiment of a method that is the subject of the present invention.

FIG. 4 shows a particular embodiment of a method 40 that is the subject of the present invention.

The actuation method 40 comprises the following steps:
- emission 41 of at least one wave 110, by a first detection means, 105, 115 and 120, emitter 105;
- reception 42 of at least one wave 110, by a first detection means, 105, 115 and 120, receiver 115;
- detection 43 of the presence and position of an object 125 by means of the at least one wave 110 received;
- activation 44 of the second detection means, 140 and 145;
- detection 45 of the presence and position of an object 125 as a function of a physical quantity 135;
- actuation 46 of an action if the position detected by the first detection means, 105, 115 and 120, matches the position detected by the second detection means, 140 and 145.

Preferably, the actuation method 40 is implemented by an actuation device 10 that is the subject of the present invention.

During the emission step 41, the wave 110 emitted by the emitter 105 is spread by the panel 120. The wave 110 is reflected onto an object 125 that reflects infrared waves, and is captured by a receiver 115 in the reception step 42. The detection of the presence of the object 125 is implemented by the first detection means, 105, 115 and 120. If the object 125 absorbs the infrared waves, the detection step 43 is not performed. The detection 43 of the position of the object 125 is a function of the place on the infrared panel 120 where the wave 110 is reflected, for example.

Once the presence of the object 125 is detected, the method 40 proceeds to the step 44 of activating the second detection means, 140 and 145.

Preferably, the detection step 45 is a function of a physical quantity 135, and the physical quantity 135 is a physical quantity of an electromagnetic wave.

During the detection step 45, the position of the object 125 detected by the second detection means, 140 and 145, is determined according to the location in the capacitive panel where the emitted signal 130 is modulated most.

In some embodiments, the method 40 comprises a step of comparison of the position detected by the first detection means in step 43 with the position detected by the second detection means in step 45. If the detected positions match, the method 40 proceeds to the step 46 of actuation of an action.

Two positions match when these detected positions have substantially the same coordinates in the same reference space, in one or two dimensions, for example an orthogonal reference space. This match is therefore determined with a tolerance.

The step 46 of actuation of an action is implemented if:
   a presence of the object 125 is detected in the detection step 43;
   a presence of the object 125 is detected in the detection step 45; and
   the position detected in the detection step 43 matches the position detected in the detection step 45.

The action actuated is an action for raising the temperature, reducing the temperature or switching on a timer, for example. The action actuated is a function of the detected position.

As can be seen in light of the preceding description, the utilization of the present invention therefore enables a contact or contactless actuation of an appliance. In addition, as two different waves are used to detect the presence and position of the object, actuation triggering errors are avoided and the device has greater reliability. Also, as the second detection means are only activated if the first detection means detect the presence of the object, energy savings are realized.

In addition, utilization of the present invention has the advantage of offering an actuation device having the combined advantages of two detection means while eliminating, or at least reducing, their disadvantages.

Figure 5:
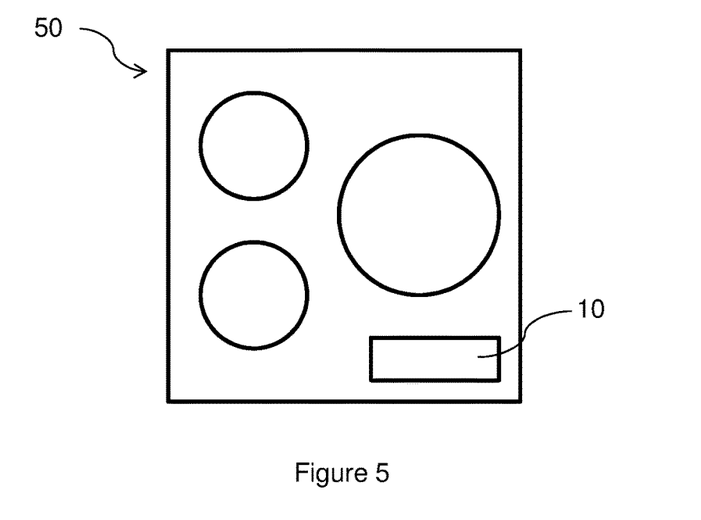
FIG. 5 represents, schematically, a particular embodiment of an appliance that is the subject of the present invention.

FIG. 5 shows an embodiment of an embodiment 50 of an appliance that is the subject of the present invention.

The appliance 50 has at least one function, and comprises at least one actuation device that is the subject of the present invention, actuating said function of the appliance.

In some embodiments, the appliance 50 is a medical appliance or an elevator, for example. The appliance 50 can also be a household appliance, for example comprising cooktops or an oven, the working of which is actuated by an actuation device that is the subject of the present invention.

Actuations of the appliance 50 are performed by a user by means of an actuation device 10. The actuations are preferably performed with the user having no contact with the appliance 50. In some embodiments, the actuations are performed with the user having contact with the appliance 50.

The action actuated is an action for raising the temperature, reducing the temperature or switching on a timer, for example. The action actuated is a function of the detected position of a part of the user's body relative to the actuation device 10.

Figure 6:
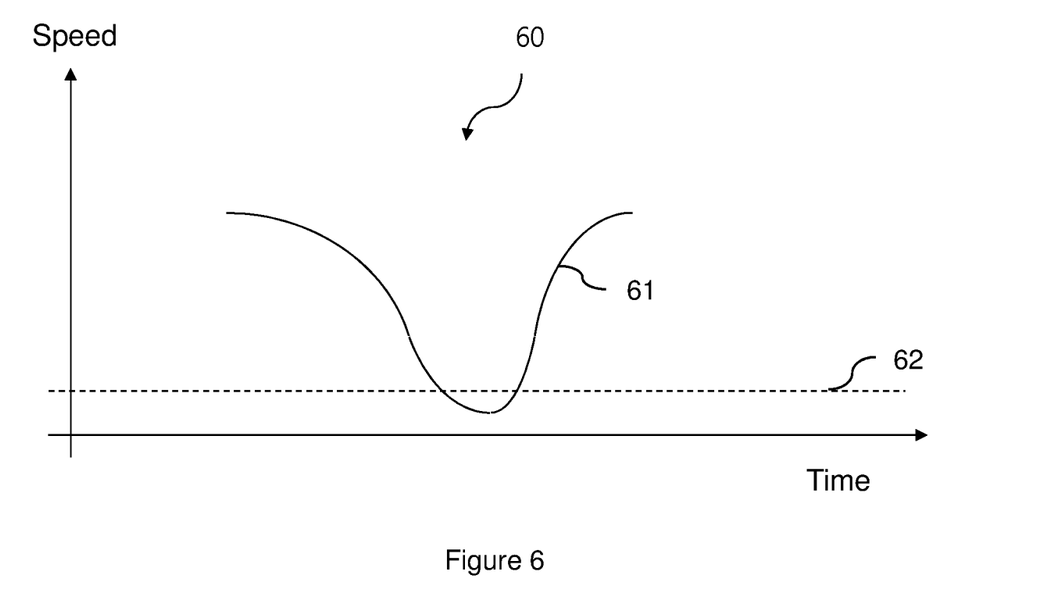
FIG. 6 represents a curve plotting speed over time.

FIG. 6 shows a curve 60 plotting a movement speed 61 over time of the position of an object detected by at least one means for detecting the object.

As described with reference to FIGS. 1 to 5, the detection means supply an estimate of the object's position. The object's speed is determined, along at least one axis, by the difference in position between two instants.

Therefore, the detection means are configured to supply a position of an object interfering with at least one electromagnetic field, and a speed determination means supplies a speed of motion of the object according to the position of the object supplied by the detection means.

In some preferred embodiments, the speed determined in this way is compared with a predefined limit value 62. For example, the predefined limit value 62 is one centimeter per second.

The actuation means are configured to actuate an action if:
   the detection means supply a position of the object; and
   the speed of the object is lower than a predefined speed value.

The action actuated is the one associated with the position of the object when its speed reaches the predefined limit value, or when the speed reaches its minimum value and this minimum value is lower than the predefined limit value.

The predefined limit value can be set by design, adjusted by the user or calibrated by the device itself, for example during an installation phase during which the user is asked to point his finger towards each symbol representing an action likely to be actuated by the actuation device that is the subject of the present invention.

Figure 7:
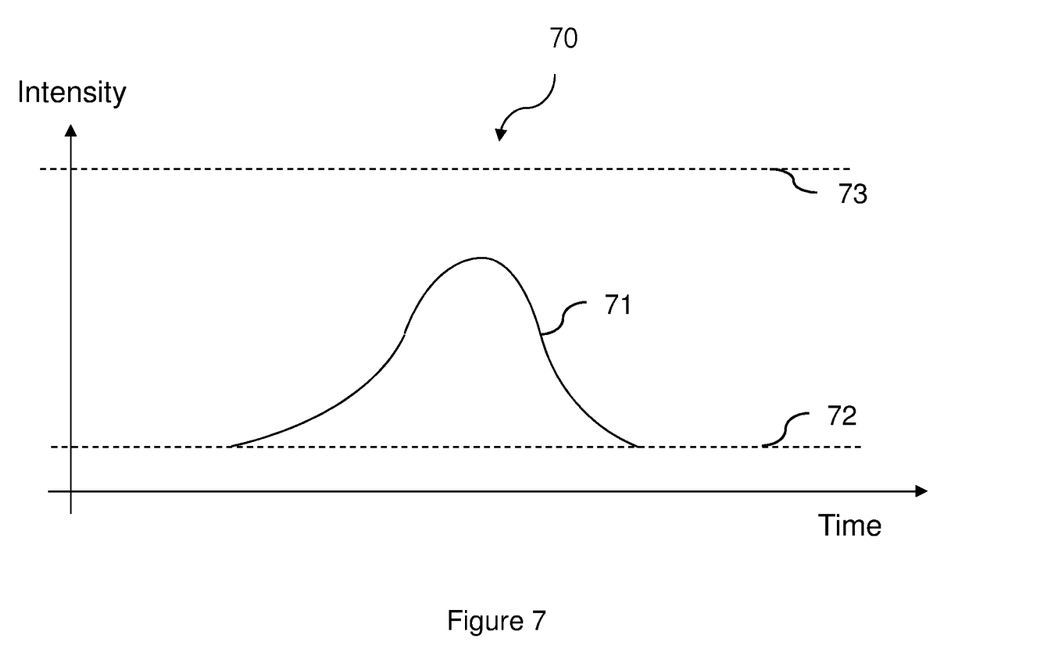
FIG. 7 represents a curve plotting detection intensity over time.

FIG. 7 represents a curve 70 plotting the intensity over time of the interference between the object and the electromagnetic field detected by the detection means. The detection is performed when this intensity is between a predefined minimum intensity limit value 72 and a predefined maximum intensity limit value 73.

For example, the predefined minimum intensity limit value 72 is twice the intensity of the ambient noise measured. For example, the predefined maximum intensity limit value 73 is three-quarters of the saturation value of the detection means. According to another example, the predefined maximum intensity limit value 73 is greater than the maximum intensity found during a learning phase with a sample of objects, eg fingers, representative of the human diversity of body shapes and skin colors.

In this way, the detection means are configured to supply an intensity of detection of the object according to the quantity of the object's interference with each electromagnetic field.

Preferably the actuation means is configured to actuate an action if:
   the detection means supply a position of the object;
   the speed of the object is lower than a predefined value; and
   the detection intensity is increasing or greater than a predefined intensity value.

Preferably, the predefined intensity value is a function of the maximum detection intensity reached before the decrease in the detection intensity. For example, the predefined intensity value is equal to half or three-quarters of the maximum intensity reached.

The inventor has determined that this limit value makes it possible to avoid false detections.

Figure 8:
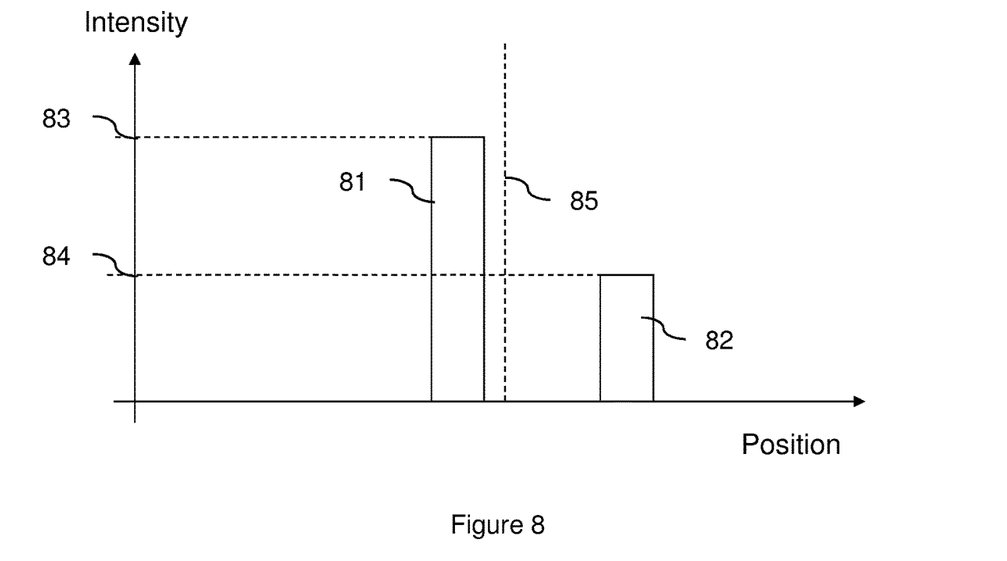
FIG. 8 represents detected and averaged positions.

FIG. 8 represents positions 81 and 82 detected by the first and second means for detecting the object, respectively, and the detection intensities 83 and 84 (ie interference with the electromagnetic fields utilized by the different sets of detection means).

In some embodiments, the detection means supply a position 85 equal to a weighted average of the positions supplied by the first detection means and by the second detection means.

Preferably, the weight assigned to the position supplied by the first detection means is a function of an intensity of the object's interference with the electromagnetic field detected by the first detection means, and the weight assigned to the position supplied by the second detection means is a function of an intensity of the object's interference with the electromagnetic field detected by the second detection means.

The position supplied in this way is more stable and closer to the actual position of the object.

Figure 9:
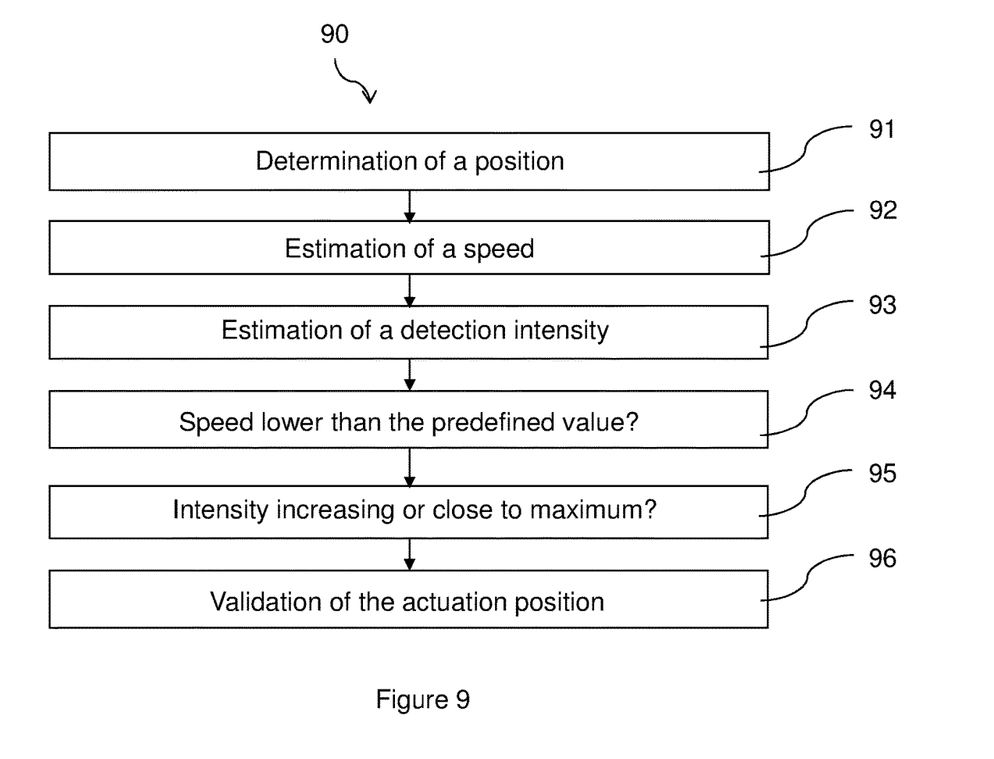
FIG. 9 represents, in the form of a logical diagram, a particular embodiment of the method that is the subject of the present invention.

FIG. 9 shows steps 91 to 96 of an actuation method 90 that is the subject of the present invention.

This method comprises the following steps:
- a step 91 of detection supplying a position of an object interfering with an electromagnetic field;
- a step 92 of determination a speed of motion of the object according to the position of the object supplied by the detection means;
- a step 93 of estimation the detection intensity;
- a step 94 of determination whether the speed is lower than a predefined value;
- a step 95 of determination whether the detection intensity is increasing or close to a maximum (ie whether its value is greater than a value function of the maximum intensity, as described above); and
- if the steps 94 and 95 supply positive results, a step of actuation of an action associated to the position of the object.

In some variants, the steps 93 and 95 are eliminated.

In some embodiments, the actuation means are configured to actuate an action if the speed determination means determine that the first detection means detect a speed greater than a predefined speed value, and the second detection means detect the user pressing on the device.

Thanks to these provisions, an action is actuated although the initial speed of the object, determined with the first detection means, is greater than the predefined speed value, the press being considered determination of a speed becoming lower than the predefined speed limit value.

Figure 10:
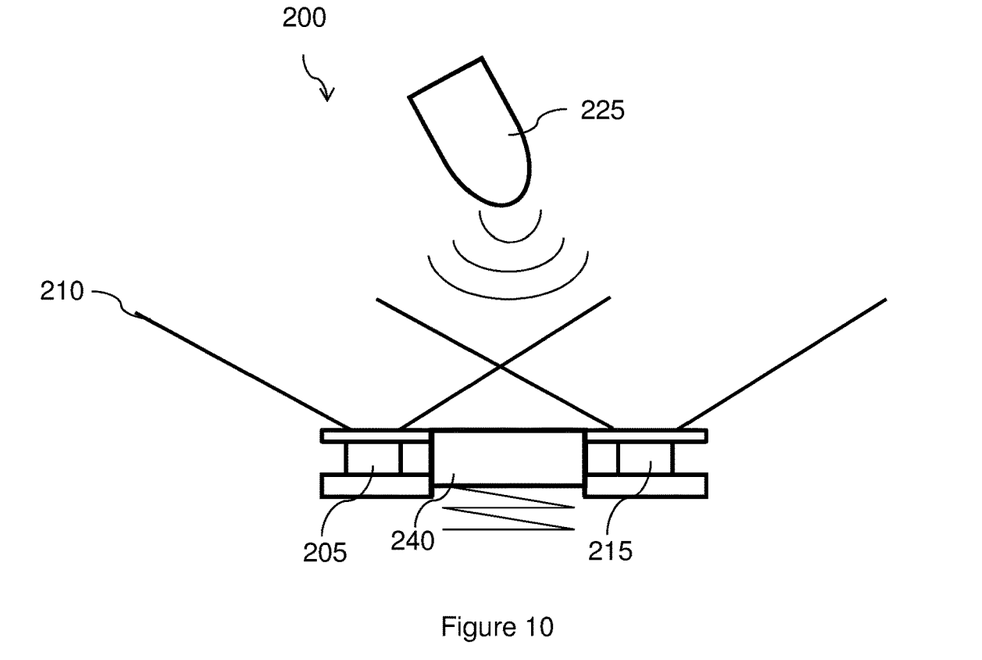
FIG. 10 represents, schematically and in cross-section, a particular embodiment of a portion of a device that is the subject of the present invention.

FIG. 10 shows a particular embodiment 200 of a device that is the subject of the present invention.

The actuation device 200 comprises first detection means, 205, 215, comprising at least one emitter 205 of infrared rays 210 and at least one receiver 215 of infrared rays 210 reflected by the object 225. The first detection means consist of an infrared panel. Preferably, each emitter 205 and each receiver 215 is an emitter-receiver of infrared rays.

The device 200 also comprises second detection means, 240, which detect the presence and position of the object 225 as a function of the object 225 pressing on the second detection means. The second detection means consist of a moving mechanical button, for example an on-off switch.

Figure 13:
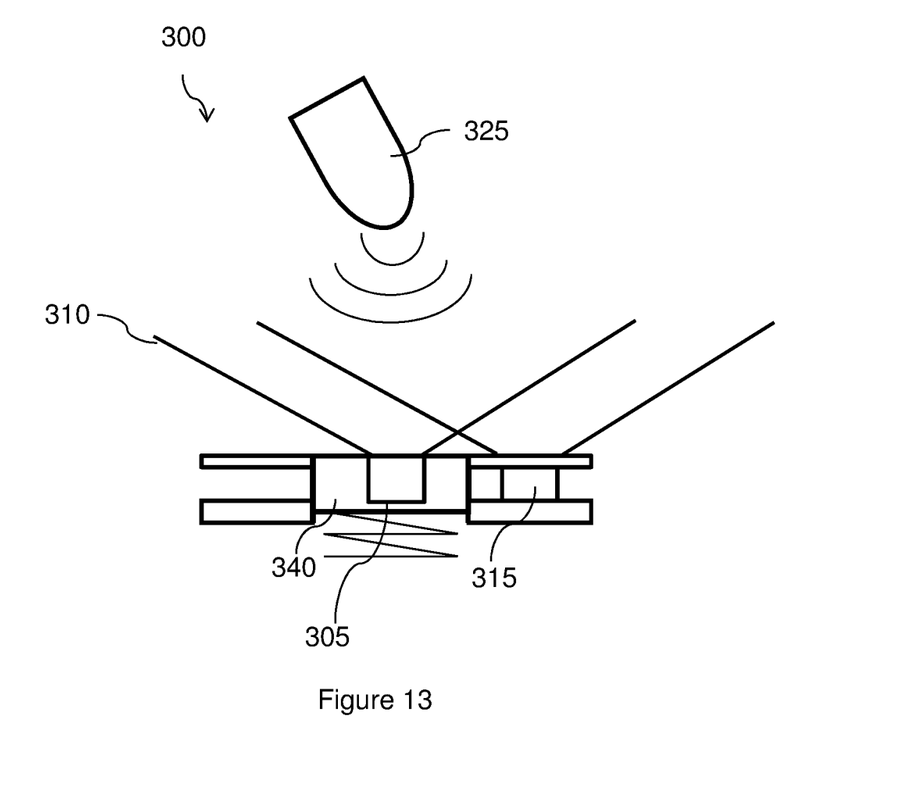
FIG. 13 represents, schematically and in cross-section, a particular embodiment of a portion of a device that is the subject of the present invention.

FIG. 13 shows a particular embodiment 300 of a device that is the subject of the present invention.

The actuation device 300 comprises first detection means, 305, 315, comprising at least one emitter 305 of infrared rays 310 and at least one receiver 315 of infrared rays 310 reflected by the object 325. The first detection means consist of an infrared panel. Preferably, each emitter 305 and each receiver 315 is an emitter-receiver of infrared rays.

The device 300 also comprises second detection means, 340, which detect the presence and position of the object 325 as a function of the object 325 pressing on the second detection means. The second detection means consist of a moving mechanical button, for example an on-off switch.

In this embodiment, an emitter 305 of infrared rays is located in the central moving portion of the moving mechanical button 340. In a variant, a receiver of infrared rays is located in the central moving portion of the moving mechanical button.

Figure 11:
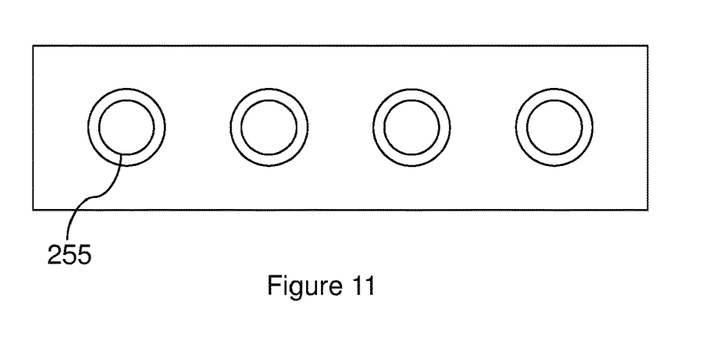
FIGS. 11 and 12 represent, schematically and in a top view, examples of geometric arrangements of devices along and on either side of a straight line.
Figure 12:
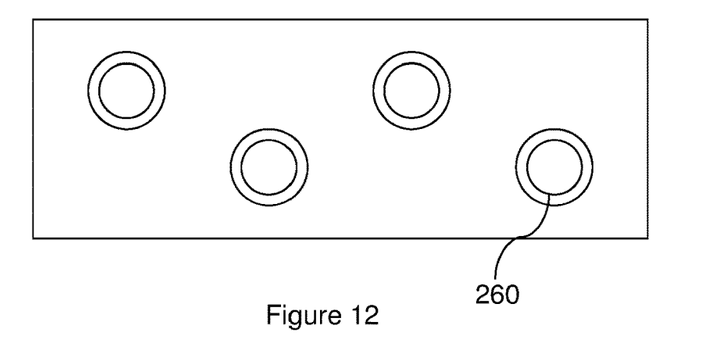

FIGS. 11 and 12 illustrate examples of combinations of various devices as illustrated in FIG. 10, allowing a mesh network to be created. One of the advantages of utilizing the present invention is the possibility of linking the buttons together to form a smart mesh network. If the system detects that several devices are activated simultaneously, it does not take the infrared detection into account and only takes the mechanical detection into account.

Since the mechanical button is coupled with the infrared system and with its "intelligence", mechanical malfunctions (wear of parts) can also be spotted.

FIG. 11 illustrates an arrangement of devices 255 along a straight line.

FIG. 12 illustrates an arrangement of devices 255 on alternating sides of a straight line.

The position and speed of the object mentioned with reference to the figures, in particular FIGS. 6 and 8, are determined along this straight line.

In all the embodiments, a visual (indicator light) or sound indicator can be added to signal that the object has been detected and the action validated. In the embodiments comprising a button (see, for example, FIGS. 10 and 13), an indicator light can be placed at the center of the button or on the outside of the button.

The invention claimed is:

1. Actuation device, comprising:
   a first detector including at least one emitter of at least one wave and at least one receiver configured to detect said at least one wave and to detect the presence and position of an object in accordance with interference of the object with an electromagnetic field of said wave;
   a second detector configured for detecting presence and position of an object by detecting a physical quantity of an electromagnetic field said physical quantity differing by at least one characteristic from the wave received by the first detector;
   and
   an actuator configured to actuate an action if:
   the first detector supplies a position of the object; and
   a speed of the object is lower than a predefined speed value wherein said speed is determined by detecting at least two positions of the object over a period of time and by calculating the difference in between said at least two positions; and
   wherein said actuator is configured such that if the first detector detects more than one position of the object, the actuator actuates an action only if the second detector provides a position of the object wherein said action is actuated in accordance with the position provided by the second detector.

2. Device according to claim 1, wherein the first detector and second detector are configured to supply an intensity of detection of the object according to the quantity of the object's interference with each electromagnetic field.

3. Device according to claim 2, wherein the actuator is further configured to actuate an action if:
   the detection intensity is increasing or greater than a predefined intensity value.

4. Device according to claim 3, wherein the predefined intensity value is a function of the maximum detection intensity reached before the decrease in the detection intensity.

5. Device according to claim 1, wherein the second detector is only activated if the first detector detects the presence of the object.

6. Device according to claim 1, wherein the detector supplies a position equal to a weighted average of the positions supplied by the first detector and by the second detector.

7. Device according to claim 6, wherein the position supplied by the first detector is a function of an intensity of the object's interference with the electromagnetic field detected by the first detector, and the weight assigned to the position supplied by the second detector is a function of an intensity of the object's interference with the electromagnetic field detected by the second detector.

8. Device according to claim 1, wherein the second detector detects the presence and position of the object without a user's contact with the device.

9. Device according to claim 1, wherein the second detector detects the presence and position of the object by a user's contact with the device.

10. Device according to claim 1, wherein the second detector detects the presence and position of the object by a user pressing on the device.

11. Device according to claim 10, wherein the actuator is configured to actuate an action if said speed is greater than a predefined speed value, and the second detector detects the user pressing on the device.

12. Device according to claim 1, wherein the second detector comprises an emitter and a receiver of infrared rays, and the second detector comprises a moving mechanical button.

13. Device according to claim 1, wherein an electromagnetic field detected by the first detector takes the form of an infrared wave.

14. Device according to claim 13, wherein at least one emitter or receiver of the first detector is associated with at least one mask, whose transparent portion, for at least one wavelength used by the emitter, is elongated in the direction of a receiver able to detect the wave of said wavelength.

15. Device according to claim 13, wherein the presence of the object is detected for a power of the wave received, by a receiver of the presence detector, inferior to a predefined limit value.

16. Device according to claim 1, wherein the first and second detectors are configured to detect the presence of the object for an intensity of the object's interference with the electromagnetic field inferior to a predefined limit value.

* * * * *